(12) United States Patent
Fagginger Auer et al.

(10) Patent No.: US 10,488,768 B2
(45) Date of Patent: Nov. 26, 2019

(54) BEAT PATTERNS FOR ALIGNMENT ON SMALL METROLOGY TARGETS

(71) Applicant: ASML NETHERLANDS B.V., Veldhoven (NL)

(72) Inventors: Bastiaan Onne Fagginger Auer, Eindhoven (NL); Paul Christiaan Hinnen, Veldhoven (NL); Hugo Augustinus Joseph Cramer, Eindhoven (NL); Anagnostis Tsiatmas, Eindhoven (NL); Mariya Vyacheslavivna Medvedyeva, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/115,047

(22) Filed: Aug. 28, 2018

(65) Prior Publication Data
US 2019/0072860 A1    Mar. 7, 2019

(30) Foreign Application Priority Data

Sep. 7, 2017    (EP) .................................... 17189740

(51) Int. Cl.
*G03F 9/00*    (2006.01)
*G03F 7/20*    (2006.01)

(52) U.S. Cl.
CPC ........ *G03F 9/7076* (2013.01); *G03F 7/70141* (2013.01); *G03F 7/70616* (2013.01); *G03F 7/70683* (2013.01); *G03F 9/7042* (2013.01); *G03F 9/7088* (2013.01)

(58) Field of Classification Search
CPC .......................... G03F 7/70633; G03F 9/7076
See application file for complete search history.

(56) References Cited

U.S. PATENT DOCUMENTS

| | | | | |
|---|---|---|---|---|
| 5,216,257 A  * | 6/1993 | Brueck | ............... | G03F 7/70633 250/237 G |
| 5,701,013 A  * | 12/1997 | Hsia | ....................... | G01Q 40/02 250/491.1 |
| 6,128,089 A  * | 10/2000 | Ausschnitt | .......... | G03F 7/70625 250/548 |
| 6,730,444 B2 * | 5/2004 | Bowes | ................ | G03F 7/70625 382/145 |

(Continued)

FOREIGN PATENT DOCUMENTS

| | | |
|---|---|---|
| WO | 2009/078708 | 6/2009 |
| WO | 2009/106279 | 9/2009 |

OTHER PUBLICATIONS

International Search Report and Written Opinion issued in corresponding PCT Patent Application No, PCT/EP2018/072305, dated Dec. 3, 2018.

*Primary Examiner* — Steven Whitesell Gordon
(74) *Attorney, Agent, or Firm* — Pillsbury Winthrop Shaw Pittman LLP

(57) ABSTRACT

A target formed on a substrate, the target having: an alignment structure; and a metrology structure; wherein the alignment structure comprises structures that are arranged to generate a beat pattern when the alignment structure is illuminated with source radiation. Advantageously, when the target is illuminated, the beat pattern that appears in an image of the target allows the target to be easily identified using a pattern recognition technique.

20 Claims, 6 Drawing Sheets

(56) References Cited

U.S. PATENT DOCUMENTS

| | | | |
|---|---|---|---|
| 7,408,642 B1* | 8/2008 | DiBiase | G03F 9/7076 356/399 |
| 7,561,282 B1* | 7/2009 | Widmann | G03F 7/70625 356/401 |
| 2003/0223630 A1* | 12/2003 | Adel | G03F 7/705 382/145 |
| 2004/0246482 A1* | 12/2004 | Sezginer | G01N 21/4788 356/401 |
| 2005/0195398 A1 | 9/2005 | Adel et al. | |
| 2006/0044568 A1* | 3/2006 | Weiss | G03F 7/70633 356/509 |
| 2006/0250597 A1* | 11/2006 | Nakajima | G03F 7/70633 355/55 |
| 2008/0266561 A1* | 10/2008 | Kandel | G01B 11/272 356/399 |
| 2011/0051150 A1* | 3/2011 | Choi | G03F 7/70633 356/620 |
| 2013/0120739 A1* | 5/2013 | Dai | G03F 7/70625 356/72 |
| 2014/0065832 A1 | 3/2014 | Hsieh et al. | |
| 2014/0375984 A1* | 12/2014 | Choi | G01N 21/93 356/73 |
| 2015/0278426 A1 | 10/2015 | Ning et al. | |
| 2016/0313656 A1* | 10/2016 | Van Dommelen | G03F 7/70683 |

\* cited by examiner

Fig. 4
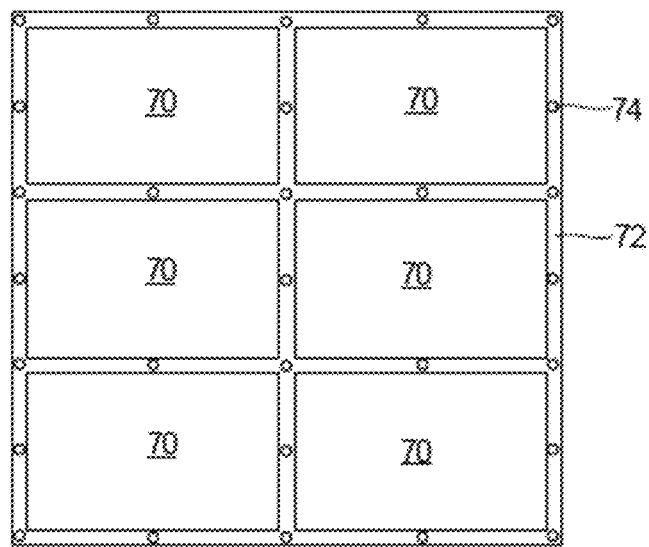
Fig. 5(a) Fig. 5(b) Fig. 5(c)
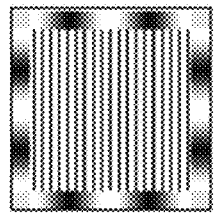 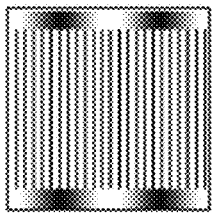 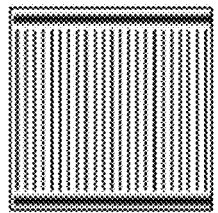 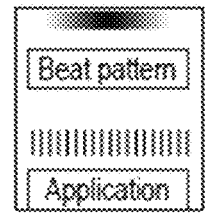

BEAT PATTERNS FOR ALIGNMENT ON SMALL METROLOGY TARGETS

This application claims the benefit of priority of European Patent Application No. 17189740, filed on Sep. 7, 2017. The content of the foregoing application is incorporated herein in its entirety by reference.

FIELD

The present description relates to methods and apparatus for measuring a target formed on a substrate, a lithographic cell, and a target.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Various forms of metrology apparatuses, such as scatterometers, have been developed for use in the lithographic field. For example, certain metrology apparatuses direct a beam of radiation onto a target and measure one or more properties of the scattered radiation—e.g., intensity at a single angle of reflection, or over a range of angles of reflection, as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target by iterative approaches implemented using rigorous coupled wave analysis or finite element methods; library searches; and/or principal component analysis.

Targets may be measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which documents are hereby incorporated in their entireties by reference.

Intensity asymmetry between different diffraction orders (e.g. between $-1^{st}$ and the $+1^{st}$ diffraction orders) for a given overlay target provides a measurement of target asymmetry; that is, asymmetry in the target. This asymmetry in the overlay target can be used as an indicator of overlay (undesired misalignment of two layers).

SUMMARY

It may be desirable for targets to be positioned in locations where there is little space available for the targets, for example in product areas containing structures of a product being manufactured. Targets positioned in such areas need to be small. It is challenging to align radiation spots with such targets with sufficient accuracy.

It is desirable to improve existing methods and apparatus for measuring targets.

According to an aspect, there is provided a target formed on a substrate, the target comprising: an alignment structure; and a metrology structure; wherein the alignment structure comprises structures that are arranged to generate a beat pattern when the alignment structure is illuminated with source radiation.

In an embodiment, the beat pattern is a series of peaks and troughs along an image of the alignment structure.

In an embodiment, the structures comprised by the alignment structure are provided by a plurality of spaced straight lines in a single layer of the substrate.

In an embodiment, the widths of the lines vary along the structures comprised by the alignment structure.

In an embodiment, the variation in line widths repeats periodically with a period that is larger than the pitch of the metrology structure.

In an embodiment, the variation in line widths repeats periodically with a period that is between 3 and 50 times larger than a pitch of the metrology structure.

In an embodiment, the line spacing between sets of adjacent lines is substantially constant.

In an embodiment, each line spacing is either close to or at a pitch of the metrology structure.

In an embodiment, each line spacing is within 10% of the pitch of the metrology structure.

In an embodiment, the line widths and period that the line widths repeat are determined in dependence on the wavelength of the source radiation.

In an embodiment, the structures comprised by the alignment structure are provided by a grating in each of a plurality of layers of the substrate.

In an embodiment, a first layer of the substrate comprises a first grating with a first pitch, and a second layer of the substrate comprises a second grating with a second pitch that is different from the first pitch.

In an embodiment, the first pitch and second pitch are close to a pitch of the metrology structure.

In an embodiment, the first pitch and second pitch are within 10% of the pitch of the metrology structure.

In an embodiment, the first pitch and second pitch have a large least common multiple.

In an embodiment, the least common multiple of the first pitch and second pitch is between 3 and 50 times the first pitch.

In an embodiment, the first pitch and second pitch are determined in dependence on the wavelength of source radiation.

In an embodiment, the metrology structure comprises a periodic structure.

In an embodiment, when the structures comprised by the alignment structure are illuminated with source radiation, a beat pattern is generated that has peaks and troughs parallel to a direction of periodicity of the periodic structure within the metrology structure.

In an embodiment, the metrology structure comprises a plurality of parallel straight lines that are all parallel to two edges of the target.

In an embodiment, the target is rectangular and desirably square; and the metrology structure within the target is rectangular and desirably square.

In an embodiment, the alignment structure comprises four elongate segments with each elongate segment arranged between an edge of the outer perimeter of the metrology structure and an edge of the inner perimeter of the target.

In an embodiment, for each of the four elongate segments of the alignment structure, structures within the elongate segment are arranged to generate a beat pattern that has peaks and troughs along the length of an image of the elongate segment.

In an embodiment, the alignment structure comprises exactly two elongate segments with each elongate segment arranged between an edge of the outer perimeter of the metrology structure and an edge of the inner perimeter of the target; the elongate segments are provided on opposite sides of the metrology structure; and the longitudinal axis of each elongate segment is orthogonal to a direction of periodicity of a periodic structure within the metrology structure.

In an embodiment, for each of the two elongate segments of the alignment structure, structures within the elongate segment are arranged to generate a beat pattern that has peaks and troughs along the length of an image of the elongate segment.

In an embodiment, for each of the two elongate segments of the alignment structure, structures within the elongate segment are arranged to generate a beat pattern that has peaks and troughs along the width of an image of the elongate segment.

In an embodiment, part of the alignment structure in one or more corners of the target are non-periodic.

In an embodiment, an overall reflectance of the metrology structure in respect of illumination by source radiation, averaged over the metrology structure, differs from an overall reflectance of the one or more non-periodic parts of the alignment structure in respect of illumination by the source radiation, averaged over the parts of the alignment structure, by at least 20%.

In an embodiment, the target is a square; and the length of each side of the target is 5 µm.

In an embodiment, the target is a square; and the length of each side of the target is 2 µm.

In an embodiment, the structures comprised by the alignment structure are arranged such that, when the alignment structure is illuminated with source radiation, the detected radiation resulting from scattering of the source radiation by the target comprises higher order diffracted rays than the zeroth order.

In an embodiment, a pitch of the metrology structure is less than 100 nm.

In an embodiment, the surface area of the metrology structure is between 3 and 12 times the surface area of the alignment structure.

According to an aspect, there is provided a method of measuring a target formed on a substrate, the target comprising an alignment structure and a metrology structure, wherein the method comprises: a first measurement process comprising illuminating the target with first radiation and detecting radiation resulting from scattering of the first radiation from the target; and a second measurement process comprising illuminating the target with second radiation and detecting radiation resulting from scattering of the second radiation from the target, wherein: the first measurement process detects a position of the alignment structure; the second measurement process uses the position of the alignment structure detected by the first measurement process to align a radiation spot of the second radiation onto a desired location within the metrology structure; and the target is a target as described herein.

In an embodiment, the structures comprised by the alignment structure are sub-resolution of the first measurement process.

In an embodiment: the first measurement process comprises forming an image of the alignment structure and the metrology structure.

In an embodiment, the first measurement process uses computer-implemented pattern recognition to detect the alignment structure.

In an embodiment, the first measurement process detects the alignment structure in dependence on beat patterns that are generated when the alignment structure is illuminated by the first radiation.

In an embodiment, the first measurement process does not detect the alignment structure in dependence on the zeroth order ray in the detected radiation resulting from scattering of the first radiation by the target to detect the alignment structure; and the first measurement process detects the alignment structure in dependence on higher order rays than the zeroth mode in the detected radiation resulting from scattering of the first radiation by the alignment structure to detect the alignment structure.

According to an aspect, there is provided a metrology apparatus for measuring a target formed on a substrate, comprising:

a first measurement system configured to illuminate the target with first radiation and detect radiation resulting from scattering of the first radiation from the target;

a second measurement system configured to illuminate the target with second radiation and detect radiation resulting from scattering of the second radiation from the target; and a controller configured to:
  detect a position of the alignment structure using the radiation detected by the first measurement system; and
  control the second measurement system to use the detected position of the alignment structure to align a radiation spot of the second radiation onto a desired location within the metrology structure; wherein the target is a target as described herein.

In an embodiment, the structures comprised by the alignment structure are sub-resolution of the first measurement system.

In an embodiment, the first measurement system is configured to form an image of the alignment structure and the metrology structure.

In an embodiment, the first measurement system is configured to use computer-implemented pattern recognition to recognize the alignment structure.

In an embodiment, the first measurement system is configured to detect the alignment structure in dependence on beat patterns that are generated when the alignment structure is illuminated by the first radiation.

In an embodiment, the first measurement system is configured to not detect the alignment structure in dependence on the zeroth order ray in the detected radiation resulting from scattering of the first radiation by the target to detect the alignment structure; and the first measurement system is configured to detect the alignment structure in dependence on higher order rays than the zeroth mode in the detected radiation resulting from scattering of the first radiation by the alignment structure to detect the alignment structure.

According to an aspect, there is provided a lithographic cell comprising a lithographic apparatus configured to perform a lithographic process to define a target on a substrate, and a metrology apparatus as described herein configured to measure the target.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 4 depicts targets positioned in a scribe lane outside of product areas;

FIGS. 5(a), 5(b) and 5(c) show beat patterns along illuminated alignment structures according to embodiments;

DETAILED DESCRIPTION OF EXEMPLARY EMBODIMENTS

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present invention may be implemented.

Figure 1:
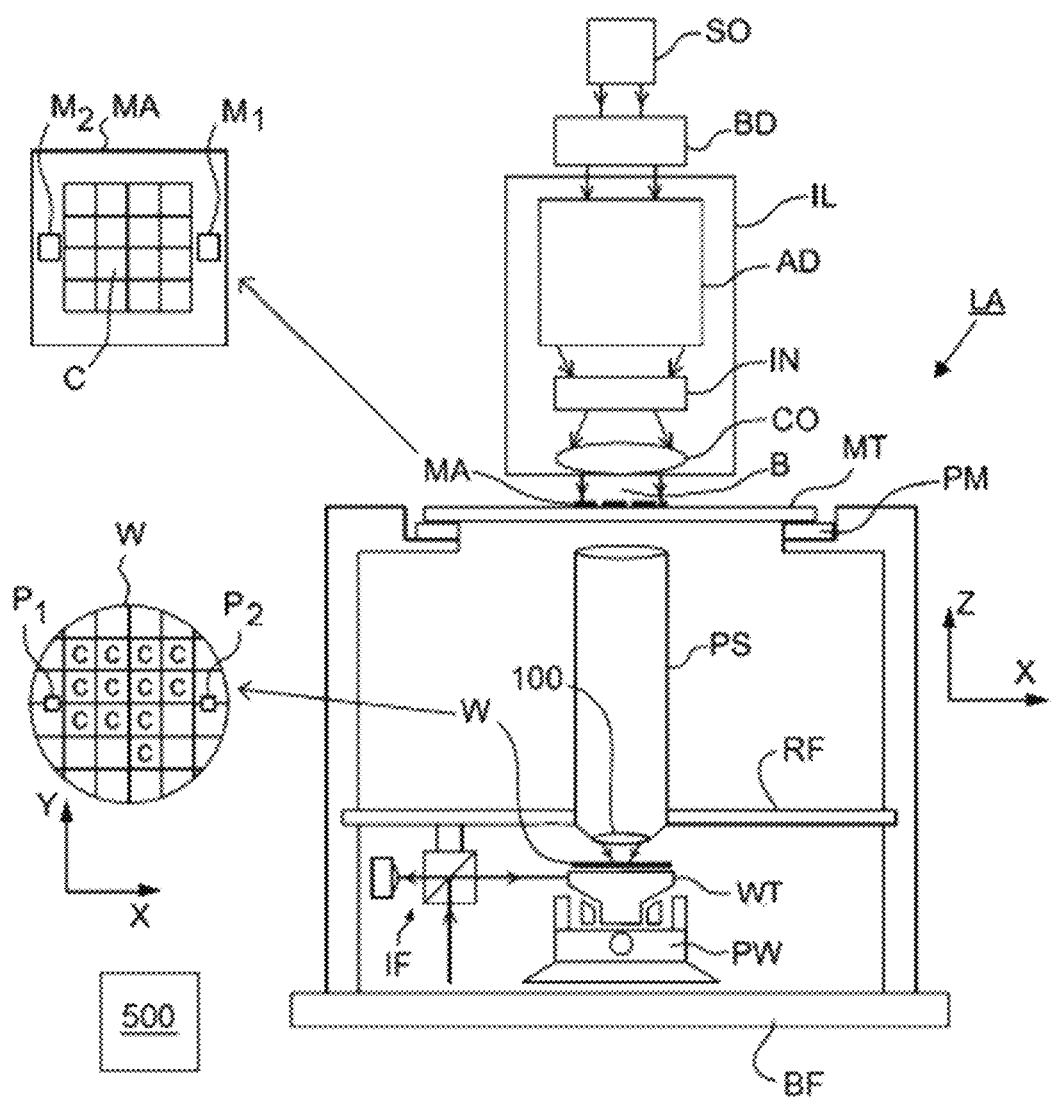
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic, or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing various types of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

In this embodiment, for example, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables and, for example, two or more patterning device support structures. In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (which are commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam to have a desired uniformity and intensity distribution in its cross section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g., after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribelane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e., a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
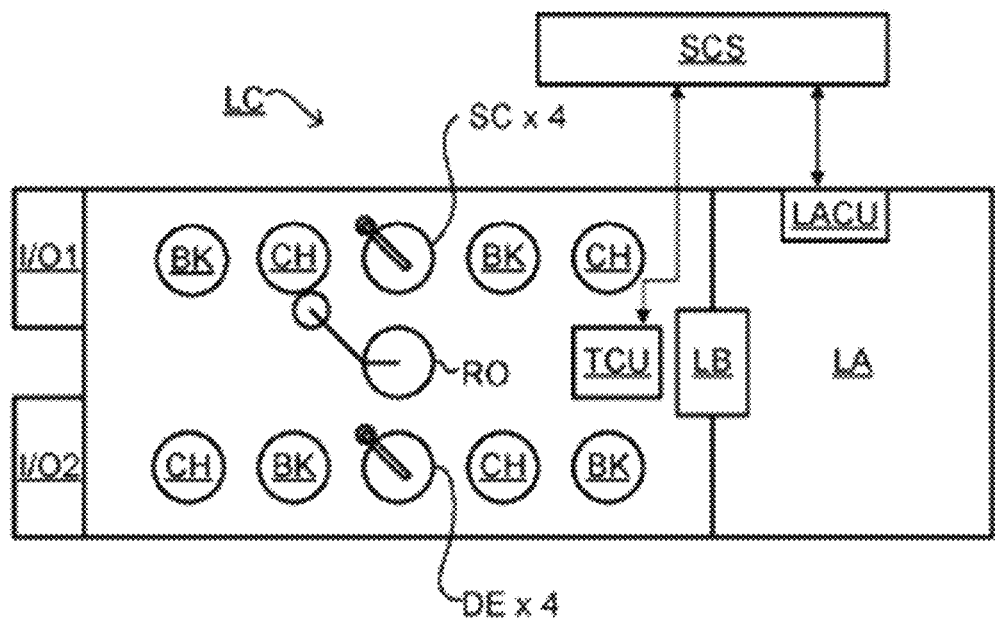
FIG. 2 depicts a lithographic cell or cluster.

As shown in FIG. 2 the lithographic apparatus LA forms part of a lithographic cell LC, also sometimes referred to as a lithocell or cluster, which also includes apparatus to perform pre- and post-exposure processes on a substrate. Conventionally these include one or more spin coaters SC to deposit resist layers, one or more developers DE to develop exposed resist, one or more chill plates CH and/or one or more bake plates BK. A substrate handler, or robot, RO picks up substrates from input/output ports I/O1, I/O2, moves them between the different process apparatuses and delivers them to the loading bay LB of the lithographic apparatus. These devices, which are often collectively referred to as the track, are under the control of a track control unit TCU that is itself controlled by the supervisory control system SCS, which also controls the lithographic apparatus via lithography control unit LACU. Thus, the different apparatuses can be operated to maximize throughput and processing efficiency.

In order that the substrates that are exposed by the lithographic apparatus are exposed correctly and consistently, it is desirable to inspect exposed substrates to measure one or more properties such as overlay between subsequent layers, line thicknesses, critical dimensions (CD), etc. If errors are detected, adjustments, for example, can be made to exposures of subsequent substrates, especially if the inspection can be done soon and fast enough that other substrates of the same batch are still to be exposed. Also, already exposed substrates may be stripped and reworked to improve yield, or possibly be discarded, thereby avoiding performing exposures on substrates that are known to be faulty. In a case where only some target portions of a substrate are faulty, further exposures can be performed only on those target portions that are deemed to be non-faulty.

A metrology apparatus is used to determine one or more properties of the substrates, and in particular, how the values of one or more properties of different substrates or different layers of the same substrate vary from layer to layer. The metrology apparatus may be integrated into the lithographic apparatus LA or the lithocell LC or may be a stand-alone device. To enable rapid measurements, it is desirable that the metrology apparatus measure one or more properties in the exposed resist layer immediately after the exposure. However, the latent image in the resist has a very low contrast because there is only a very small difference in refractive index between the parts of the resist which have been exposed to radiation and those which have not—and not all metrology apparatus have sufficient sensitivity to make useful measurements of the latent image. Therefore measurements may be taken after the post-exposure bake step (PEB) that is customarily the first step carried out on exposed substrates and increases the contrast between exposed and unexposed parts of the resist. At this stage, the image in the resist may be referred to as semi-latent. It is also possible to make measurements of the developed resist image, at which point either the exposed or unexposed parts of the resist have been removed, or after a pattern transfer step such as etching. The latter possibility limits the possibilities for rework of faulty substrates but may still provide useful information.

Figure 3A:
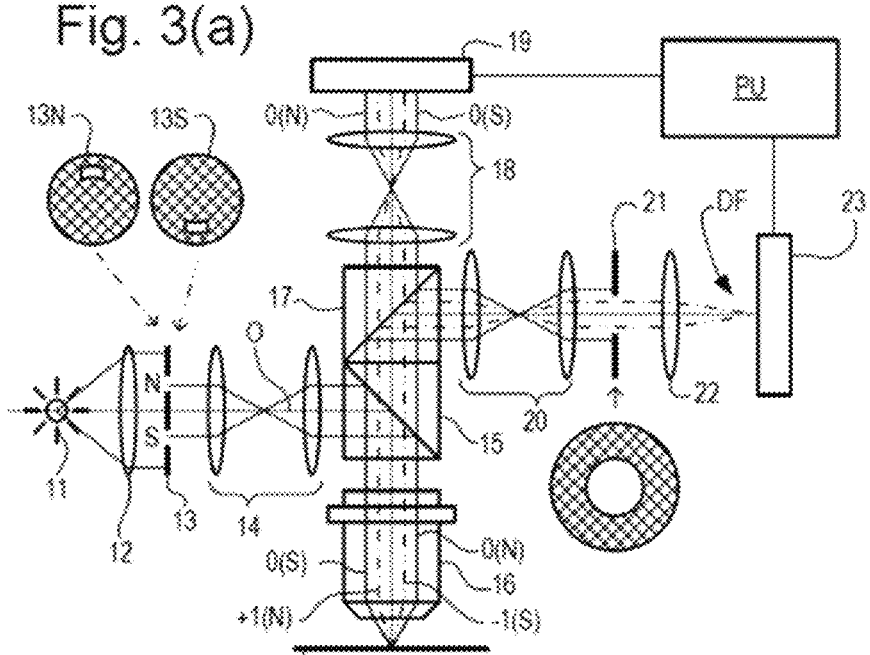
FIG. 3(a) depicts a schematic diagram of a metrology apparatus in the form of dark field scatterometer for use in measuring targets.

An example metrology apparatus is shown in FIG. 3(a). A target T and diffracted rays of measurement radiation used to illuminate the target are illustrated in more detail in FIG. 3(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, radiation emitted by source 11 (e.g., a xenon lamp) is directed onto substrate W via optical element 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary radiation outside the desired illumination mode will interfere with the desired measurement signals.

Figure 3B:
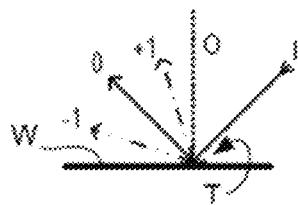
FIG. 3(b) depicts a detail of a diffraction spectrum of a target grating for a given direction of illumination.

As shown in FIG. 3(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line O) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of radiation, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 3(a) and 3(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 3(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second optical element 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 3 are purely examples. In another embodiment of the invention, on-axis illumination of the targets is used and an aperture stop with an off-axis aperture is used to pass substantially only one first order of diffracted radiation to the sensor. In yet other embodiments, $2^{nd}$, $3^{rd}$ and higher order beams (not shown in FIG. 3) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S are used to measure gratings oriented in one direction (X or Y depending on the set-up). For measurement of an orthogonal grating, rotation of the target through 90° and 270° might be implemented. The use of these, and numerous other variations and applications of the apparatus are described in patent application publications cited herein.

Figure 3C:
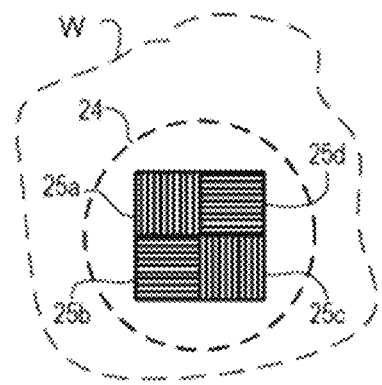
FIG. 3(c) is a schematic depiction of a form of multiple grating target and an outline of a measurement spot on a substrate.

FIG. 3(c) depicts an example (composite) target formed on a substrate. The target in this example comprises four gratings 25a to 25d positioned closely together so that they will all be within a measurement scene or measurement spot 24 formed by the metrology radiation illumination beam of the metrology apparatus. The four gratings thus are all simultaneously illuminated and simultaneously imaged on sensors 19 and 23. In an example dedicated to measurement of overlay, gratings 25a to 25d are themselves composite gratings formed by overlying gratings that are patterned in different layers of, for example, the semi-conductor device formed on substrate W. Gratings 25a to 25d may have differently biased overlay offsets (deliberate mismatch between layers) in order to facilitate measurement of overlay between the layers in which the different parts of the composite gratings are formed. Such techniques are known to the skilled person and will not be described further. Gratings 25a to 25d may also differ in their orientation, as shown, so as to diffract incoming radiation in X and Y directions. In one example, gratings 25a and 25c are X-direction gratings with biases of the +d, −d, respectively. Gratings 25b and 25d are Y-direction gratings with offsets +d and −d respectively. Separate images of these gratings can be identified in the image captured by sensor 23. This is only one example of a target. A target may comprise more or fewer than four gratings, or only a single grating.

Figure 3D:
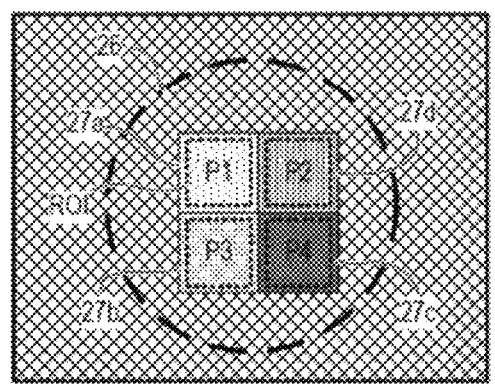
FIG. 3(d) is a schematic depiction of an image of the target of FIG. 3(c) obtained in the scatterometer of FIG. 3(a)

FIG. 3(d) shows an example of an image that may be formed on and detected by the sensor 23, using the target of FIG. 3(c) in the apparatus of FIG. 3(a). While the pupil plane image sensor 19 cannot resolve the different individual gratings 25a to 25d, the image sensor 23 can do so. The dark rectangle represents the field of the image on the sensor, within which the illuminated spot 24 on the substrate is imaged into a corresponding circular area 26. Within this, rectangular areas 27a to 27d represent the images of the small target gratings 25a to 25d. If the targets are located in product areas, product features may also be visible in the periphery of this image field. Image processor and controller PU processes these images using pattern recognition to identify the separate images 27a to 27d of gratings 25a to 25d. In this way, the images do not have to be aligned very precisely at a specific location within the sensor frame, which greatly improves throughput of the measuring apparatus as a whole.

Once the separate images of the gratings have been identified, a region of interest ROI can be identified in each individual image and the intensities of those individual images can be measured, e.g., by averaging or summing selected pixel intensity values within the identified regions of interest. Intensities and/or other properties of the images can be compared with one another. These results can be combined to measure one or more different parameters of the lithographic process. Overlay performance is an example of such a parameter.

FIG. 4 depicts example targets 74 (depicted as circular features) positioned in scribe lanes 72 surrounding product areas 70. Positioning targets 74 in scribe lanes 72 is convenient because the scribe lanes allow targets 74 to be relatively large. Furthermore, regions around targets 74 in the scribe lane 72 can be arranged to have a relatively large optical contrast with respect to the targets 74. A large optical contrast makes it easier to align radiation spots with the targets 74. In one approach an image of a region containing the target 74 is obtained. Computer-implemented pattern recognition uses the image to identify where the target 74 is located. The location is used to align a radiation spot with the target 74 during a subsequent measurement process using the target 74.

Where it is desired to perform metrology measurements at a higher spatial density over the substrate W, it may be necessary to position targets 74 at locations other than in the scribe lanes 72. This may be necessary for example where higher order corrections are to be implemented using measurements of the targets 74. It may be desirable, for example, to position targets within the product areas 70. At locations other than in the scribe lanes 72, it may be difficult to arrange for an optical contrast to be sufficiently high in the region surrounding a target 74 for the target 74 to be identified reliably using computer-implemented pattern recognition. In particular, when the size of a target is 5×5 $\mu m^2$, the contrast can be so low that the target cannot be identified in the image by pattern recognition. A micro-move, which is typically used after a long move of a substrate W to a measurement position, cannot therefore be performed to ensure that the radiation spot is correctly aligned on the target and this degrades the metrology measurements.

The contrast of the target 74 could be increased by creating high-contrast structures, or clearance areas, around the target 74 to improve alignment performance. However, a problem with this approach is that the amount of substrate W that can be used for building devices is reduced. In addition, the building of high contrast structures may not be compatible with the design capabilities and rules of the manufacturing process. Moreover, a clearance area may still not provide sufficient contrast for the pattern recognition and, in some applications, be difficult to provide.

Methods according to embodiments of the present disclosure increase the contrast of targets 74 and thereby improve the pattern recognition of each target in an image. According to embodiments, a target 74 comprises both a metrology structure and an alignment structure. The alignment structure is arranged to have a high contrast in an image and therefore aids the recognition of the target 74 so that a radiation spot can be aligned with the metrology structure.

The alignment structure comprises structures that, when illuminated by radiation, generate one or more beat patterns in an image of the illuminated alignment structure. A beat pattern is a series of peaks and troughs in the intensity of the image along the alignment structure and therefore has a high contrast. Due to their high contrast, beat patterns can be easily recognized in the image by computer-implemented pattern recognition and therefore aid the determination of the location metrology structure in the target 74 and correct positioning of the radiation spot.

FIGS. 5(a) to (c) show examples of targets 74 according to embodiments. All of the targets 74 in FIGS. 5(a) to (c) are square. However, embodiments include the targets 74 alternatively being rectangular or any other shape.

In FIG. 5(a), a square metrology structure is provided centrally within the target 74. The alignment structure is provided between the perimeter of the metrology structure and the perimeter of the target 74. The alignment structure therefore does not overlap the metrology structure. The alignment structure comprises four elongate rectangular segments. Each end of each segment may contact an end of another segment so that the segments completely surround the metrology structure in the target 74. Each of the segments comprises structures that, when illuminated by radiation, generate a beat pattern in an image of the segment of the alignment structure. As shown in FIG. 5(a), the structures are arranged to generate beat patterns with peaks and troughs in intensity along the length of each segment. Embodiments also include the structures being arranged so that a beat pattern is generated across the width of each segment. However, it is desirable for a beat pattern to be generated along the length of a segment as this beat pattern comprises more peaks and troughs and is therefore easier to detect.

FIG. 5(b) shows another embodiment of a target 74 in which the alignment structure comprises two separate elongate rectangular segments. The metrology structure is rectangular and has two sides that each extend to a side of the target 74. A first segment of the alignment structure is provided between a side of the metrology structure and a side of the target 74. A second segment of the alignment structure is provided between the opposites sides of the metrology structure and target 74. Each of the segments comprises structures that, when illuminated by radiation, generate a beat pattern in an image of the segment of the alignment structure. In FIG. 5(b), the structures are arranged to generate a beat pattern with peaks and troughs in intensity along the length of each of the two segments.

FIG. 5(c) shows another embodiment to that shown in FIG. 5(b). The only difference between the target 74 in FIG. 5(c) from that in FIG. 5(b) is the alignment structures in FIG. 5(c) comprise structures that generate a beat pattern across the width of each segment.

An advantage of providing the alignment structures as shown in FIGS. 5(b) and 5(c) is that the alignment structures occupy less of the surface area of the target 74 than that shown in FIG. 5(a). The metrology structure on the target 74 can therefore be larger. An advantage of the alignment structures in FIG. 5(b) over those in FIG. 5(c) is that the generated beat patterns comprise more peaks and troughs and are therefore easier to detect by pattern recognition. An advantage of the alignment structures in FIG. 5(b) over those in FIG. 5(c) is that the orientation of the structures in the alignment structure that generate the beat pattern are aligned with the orientation of the metrology and/or product structure. The same lithographic apparatus illumination settings can therefore be used. Embodiments also include arbitrary orientations of the structures in the alignment structure that generate the beat patterns, such that the generated beat patterns are not parallel/orthogonal to the edges of the alignment structure.

The size of the target 74 is desirably either a 5 µm×5 µm square or a 2 µm×2 µm square.

On the target 74, the surface area of the metrology structure is desirably larger than the surface area of the alignment structure. The surface area of the metrology structure is, in an embodiment, between 3 and 12 times the size of the surface area of the alignment structure.

In an embodiment, the pitch of the metrology structure is 100 nm or less.

Embodiments include the entire surface of the alignment structure comprising structures that generate a beat pattern when illuminated. However, embodiments also include providing other areas with high optical contrast on the alignment structure. In the embodiment shown in FIG. 5(a), four square high contrast areas are provided in each of the corners of the square target 74. In alternative embodiments, there are less than four high contrast areas and the high contrast areas are not provided in all the corners of the target 74. The high contrast areas may be clearance areas.

One or more of the high contrast areas are configured to have a high optical contrast with respect to surrounding areas on the substrate W such as the metrology structure. In an embodiment, an overall reflectance of the metrology structure in respect of illumination by the radiation, averaged over the metrology structure, differs from an overall reflectance of each of one or more of the high contrast areas in respect of illumination by the same radiation, averaged over the alignment structure, by at least 20%, optionally at least 50%, optionally at least 80%, or optionally at least 90%, of the overall reflectance of the high contrast area in respect of illumination by the radiation, averaged over the high contrast area. In an embodiment, the radiation comprises visible radiation, such that the overall reflectance of the metrology structure in respect of illumination by visible radiation, averaged over the metrology structure, differs from an overall reflectance of each of one or more of the high contrast areas in respect of illumination by visible radiation, averaged over the alignment high contrast areas, by at least 20%, optionally at least 50%, optionally at least 80%, or optionally at least 90%, of the overall reflectance of the high contrast areas in respect of illumination by visible radiation, averaged over the high contrast areas.

When the target 74 is illuminated to generate an image, only the one or more generated beat patterns and, optionally, the one or more high contrast areas need to be detectable in the image for the target 74 to be recognized. The structures that generate the beat pattern can be sub-resolution of the imaging system.

Figure 6:
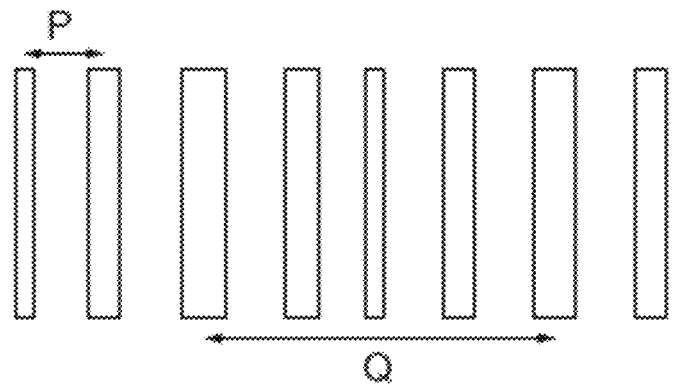
FIG. 6 shows the structures within an alignment structure according to an embodiment.

FIG. 6 shows the structures within an alignment structure, such as a segment of an alignment structure, according to an embodiment. The structures are provided within a single layer of the substrate W. The structures comprise a plurality of straight lines. In an embodiment, the spacing between each line is substantially constant but there is variation in the widths of the lines. The pitch, P, is defined as the spacing between the centers of adjacent lines. The pitch varies due to the variation in line width. In an embodiment, all of the pitches of the structures comprised by the alignment structure are close to a pitch of the metrology structure, such as within 10% of the pitch of the metrology structure. In an embodiment, the variation of the pitches of the structures comprised by the alignment structure is periodic with a period, Q, that is much larger than the pitch of the metrology structure. The period Q may be between 3 and 50 times the pitch of the metrology structure.

Advantageously, when the alignment structure is illuminated, the variation in pitch causes a beat pattern to be generated that is detectable in an image of the alignment structure. In addition, when illuminated, the structures will inherently generate higher order diffraction rays than the zeroth order.

In an embodiment, the design parameters P and Q are determined so as to maximize the intensity variation in the beat pattern, i.e. maximize contrast, for the specific wavelength that the alignment structure is illuminated by and the detection aperture used by the camera that generates the image in which the beat pattern is to be detected. This can be done by simulating the contrast on the alignment camera image and adjusting the P and Q values of the structures comprised by the metrology structure to maximize this.

Figure 7:
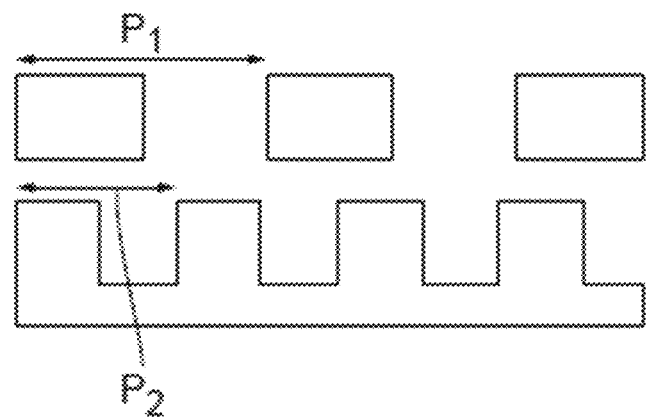
FIG. 7 shows the structures within an alignment structure according to an embodiment.

FIG. 7 shows the structures within an alignment structure, such as a segment of an alignment structure, according to a further embodiment. The structures are provided within two layers of the substrate W. Each of the structures is a grating, i.e. a plurality of straight lines with the width of each line being the same and the spacing between each line being the same. The pitch, $P_1$, of the grating in a first one of the layers is different from a pitch, $P_2$, of the grating in a second one of the layers. In an embodiment, each of $P_1$ and $P_2$ are close to a pitch of the metrology structure, such as with 10% of the pitch of the metrology structure. In an embodiment, the pitches $P_1$ and $P_2$ are not integer multiples of each other. In an embodiment, the least common multiple of the pitches is large, such as 3 to 50 times the pitch of the metrology structure.

Advantageously, when the alignment structure is illuminated, the different pitches $P_1$ and $P_2$ cause a beat pattern to be generated that is detectable in an image of the alignment structure. In addition, when illuminated, the structures will inherently generate higher order diffraction rays than the zeroth order.

In an embodiment, the design parameters $P_1$ and $P_2$ are determined so as to maximize the intensity variation in the beat pattern, i.e. maximize contrast, for the specific wavelength that the alignment structure is illuminated by and the detection aperture used by the camera that generates the image in which the beat pattern is to be detected. This can be done by simulating the contrast on the alignment camera image and adjusting the P and Q values to maximize this.

Embodiments are not restricted to the alignment structures as shown in FIGS. 6 and 7 and embodiments include any structures that generate a recognizable beat pattern in an image of the alignment structure when the alignment structure is illuminated. In particular, a variant of the embodiment shown in FIG. 7 is for gratings to be provided in more than 2 layers, such as three layers, and for no two gratings to have the same pitch. Another variant is for the structures as shown in FIG. 6 to be provided in more than one layer.

The use of the targets 74 that comprise alignment structures according to embodiments is described below.

In an embodiment, a method comprises measuring a target 74 formed on a substrate W. Example targets 74 are depicted in FIG. 5. The target 74 comprises an alignment structure that optionally comprises separate segments and also optionally comprises one or more high contrast areas.

A first measurement process is performed that comprises illuminating the target 74 with first radiation and detecting radiation resulting from scattering of the first radiation from the target 74. A second measurement process is performed that comprises illuminating the target 74 with second radiation and detecting radiation resulting from scattering of the second radiation from the target 74.

The first measurement process detects a position of the alignment structure, or some or all of the one or more segments of the alignment structure. In an embodiment, the detection comprises forming an image of the alignment structure and the metrology structure. Computer-implemented pattern recognition may then be used to recognize one or more beat patterns in the image, and/or one or more high contrast areas in the image, resulting from the illumination of the alignment structure. The position of the target 74 is thereby detected. Embodiments do not necessarily require the detection of all of the segments of an alignment structure to detect, or aid the detection of, the position of the target 74 in an image.

The metrology structure may comprise any structure suitable for performing a metrology measurement. The metrology measurement may measure a parameter of a lithographic process or of a step in a manufacturing sequence that includes at least one lithographic step. The parameter may comprise overlay or critical dimension for example. In various embodiments, the metrology structure comprises any periodic structure such as a grating or a plurality of parallel straight lines. When the metrology structure is rectangular, or square, the direction of periodicity of the periodic structure comprised by the metrology structure is desirably parallel to a side of the metrology structure, however embodiments also include the direction of periodicity not being parallel to any of the sides of the metrology structure. The metrology structure may comprise any of the structures of the target T described above with reference to FIGS. 3(a)-(d).

The second measurement process uses the position of the alignment structure detected by the first measurement process to align a radiation spot of the second radiation onto a desired location within the metrology structure (e.g. in the center of the metrology structure). The second measurement process can then measure the metrology structure.

In an embodiment, the alignment structure is detected in dependence on the higher order rays than the zeroth ray that are generated when the alignment structure is illuminated. As shown in FIG. 3(a), optical system 20,22 in the second measurement branch is used to detect the alignment structure instead of an alignment camera.

The sensing spot size should be large enough to illuminate at least the target 74 and its surroundings and a dark-field illumination aperture should be used. The target 74 and its surroundings are illuminated. The metrology structure will typically generate only zeroth order diffraction rays, which are blocked due to the dark field detection. The alignment structures will generate higher order diffraction rays. The contrast between the alignment structure and metrology structure is large and the metrology structure can therefore be aligned on the basis of the alignment structure. In an embodiment, one or more design parameters of the structures within the alignment structure are determined to maximize the contrast of the beat pattern given the illumination wavelength and illumination aperture.

Figure 8:
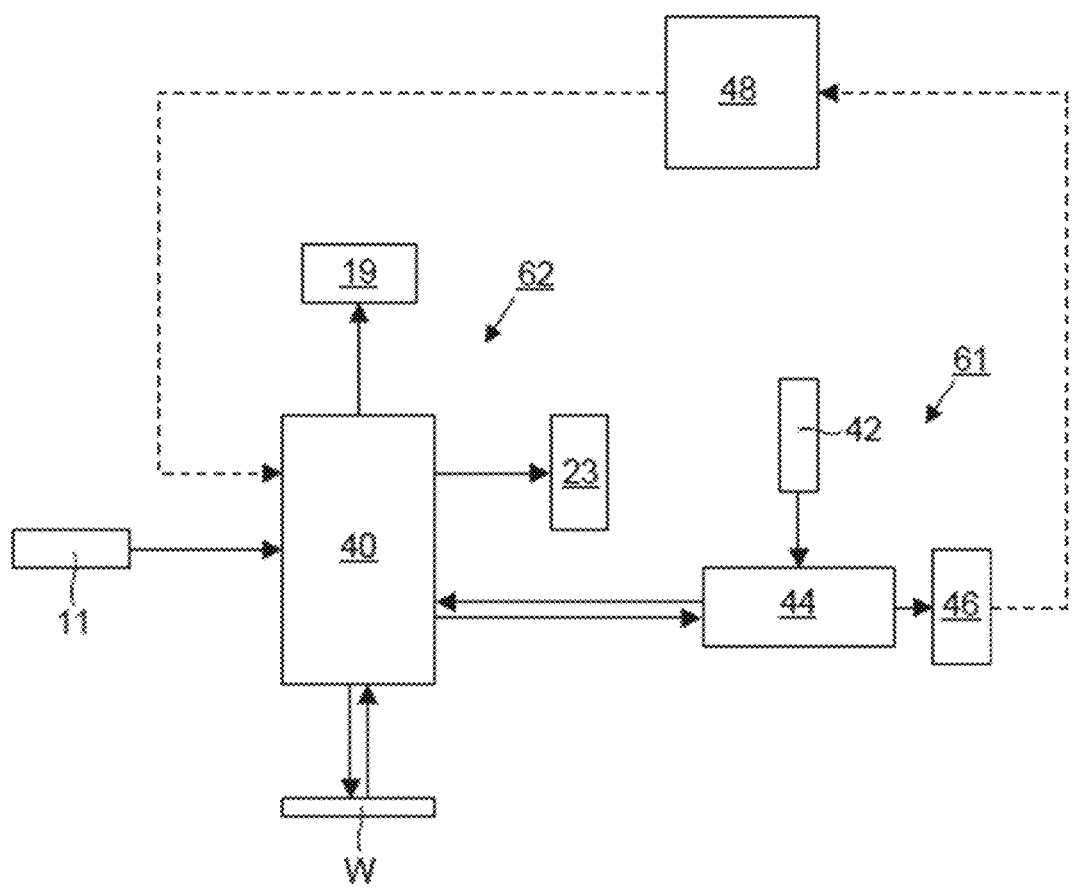
FIG. 8 depicts a metrology apparatus comprising a first measurement system, a second measurement system, and a controller.

FIG. 8 depicts an example metrology apparatus based on the above principles according to an embodiment. The metrology apparatus comprises a first measurement system 61 and a second measurement system 62. The metrology apparatus may be provided as part of a lithographic system, for example as described above with reference to FIGS. 1 and 2. The metrology apparatus is configured to measure a target 74 formed on a substrate W according to any of the methods described above.

The first measurement system 61 performs the first measurement process described above. In an embodiment, the first measurement system 61 comprises a first radiation source 42. The first radiation source 42 illuminates the target 74 with the first radiation via an optical system 44.

The second measurement system 62 performs the second measurement process described above. In an embodiment, the second measurement system 62 comprises a second radiation source 11. The second radiation source 11 illuminates the target 74 with the second radiation. In an embodiment, the first radiation source 42 is different from the second radiation source 11, for example configured to output radiation having one or more different properties and/or housed in a separate device. The radiation from the first radiation source 42 is configured to be suitable for performing the first measurement process. The radiation from the second radiation source 11 is configured to be suitable for performing the second measurement process.

The second measurement system 62 comprises an optical system 40 configured to direct radiation from the first radiation source 11 onto the substrate W. Redirected radiation from the substrate W is directed by the optical system 40 onto one or more sensors 19, 23. In an embodiment, the second measurement system 62 comprises a metrology apparatus of the type described above with reference to FIG. 3. In embodiments of this type the optical system 40 may comprise lenses 12 and 14 and an objective lens 16, as depicted in FIG. 3(*a*). The optical system 40 may further comprise an optical element 15 for directing the radiation towards the substrate W, as depicted in FIG. 3(*a*). The optical system 40 may further comprise either or both of the first measurement branch and the second measurement branch. In the particular example of FIG. 8, both of these measurement branches are provided. Example details of the optical elements of each of the measurement branches are depicted in FIG. 3(*a*). An output from the first measurement branch is directed to the sensor 19. An output from the second measurement branch is directed to the sensor 23.

In an embodiment, the optical system 40 comprises an optical element as part of the objective lens 16 (see FIG. 3(*a*)) to direct radiation from the first radiation source 42 from the optical system 44 to the substrate W and back from the substrate W to the optical system 44. The first measurement process uses an output from a sensor 46.

In an embodiment, a controller 48 is provided that detects the position of the alignment structure using the output from sensor 46. The controller 48 controls the second measurement process, performed by the second measurement system 62, using the detected position of the alignment structure to align a radiation spot of the second radiation onto a desired location within the metrology structure.

The concepts disclosed herein may find utility beyond post-lithography measurement of structures for monitoring purposes. For example, such a detector architecture may be used in future alignment sensor concepts that are based on pupil plane detection, used in lithographic apparatuses for aligning the substrate during the patterning process.

While the targets 74 described above are metrology targets, i.e. comprise metrology structures, specifically designed and formed for the purposes of measurement, in other embodiments, one or more properties may be measured on targets 74 which are functional parts of devices formed on the substrate. Many devices have regular, grating-like structures. The terms 'target grating' and 'target' as used herein do not require that the structure has been provided specifically for the measurement being performed.

The metrology apparatus can be used in a lithographic system, such as the lithographic cell LC discussed above with reference to FIG. 2. The lithographic system comprises a lithographic apparatus LA that performs a lithographic process. The lithographic apparatus may be configured to use the result of a measurement by the metrology apparatus of a structure formed by the lithographic process when performing a subsequently lithographic process, for example to improve the subsequent lithographic process.

An embodiment may include a computer program containing one or more sequences of machine-readable instructions describing methods of measuring targets on a structures and/or analyzing measurements to obtain information about a lithographic process. There may also be provided a data storage medium (e.g., semiconductor memory, magnetic or optical disk) having such a computer program stored therein. Where an existing lithography or metrology apparatus is already in production and/or in use, an embodiment of the invention can be implemented by the provision of updated computer program products for causing a processor to perform the methods described herein.

FIGS. 1, 2 and 3, and the descriptions thereof, relate to specific designs of lithographic apparatus and techniques therewith. However, embodiments also include the use of any other design of apparatus and techniques in which the detection of a target is improved due to the use of the alignment structures according to the embodiments described herein.

Further embodiments according to the invention are further described in below numbered clauses:

1. A target formed on a substrate, the target comprising:
    an alignment structure; and
    a metrology structure,
    wherein the alignment structure comprises structures that are arranged to generate a beat pattern when the alignment structure is illuminated with source radiation.
2. The target according to clause 1, wherein the beat pattern is a series of peaks and troughs along an image of the alignment structure.
3. The target according to clause 1 or clause 2, wherein the structures comprised by the alignment structure are provided by a plurality of spaced straight lines in a single layer of the substrate.
4. The target according to clause 3, wherein the widths of the lines vary along the structures.
5. The target according to clause 3 or clause 4, wherein the variation in line widths repeats periodically with a period that is larger than the pitch of the metrology structure.
6. The target according to clause 5, wherein the variation in line widths repeats periodically with a period that is between 3 and 50 times larger than the pitch of the metrology structure.
7. The target according to any of clauses 3 to 6, wherein the line spacing between adjacent lines is substantially constant.
8. The target according to any of clauses 3 to 7, wherein each line spacing is either close to or at a pitch of the metrology structure.
9. The target according to clause 8, wherein each line spacing is within 10% of the pitch of the metrology structure.
10. The target according to any of clauses 5 to 9, wherein the line widths and period that the line widths repeat are determined in dependence on a wavelength of the source radiation.
11. The target according to clause 1 or clause 2, wherein the structures comprised by the alignment structure are provided by a grating in each of a plurality of layers of the substrate.

12. The target according to clause 11, wherein:
    a first layer of the substrate comprises a first grating with a first pitch; and
    a second layer of the substrate comprises a second grating with a second pitch that is different from the first pitch.
13. The target according to clause 12, wherein the first pitch and second pitch are close to a pitch of the metrology structure.
14. The target according to clause 13, wherein the first pitch and second pitch are within 10% of the pitch of the metrology structure.
15. The target according to any of clauses 14 to 16, wherein the first pitch and second pitch have a large least common multiple.
16. The target according to clause 15, wherein the least common multiple of the first pitch and second pitch is between 3 and 50 times the first pitch.
17. The target according to any of clauses 12 to 16, wherein the first pitch and second pitch are determined in dependence on a wavelength of the source radiation.
18. The target according to any of clauses 1 to 17, wherein the metrology structure comprises a periodic structure.
19. The target according to clause 18, wherein, when the structures comprised by the alignment structure are illuminated with source radiation, a beat pattern is generated that has peaks and troughs parallel to a direction of periodicity of the periodic structure within the metrology structure.
20. The target according to clause 18 or clause 19, wherein the metrology structure comprises a plurality of parallel straight lines that are all parallel to two edges of the target.
21. The target according to any of clauses 1 to 20, wherein:
    the target is rectangular and desirably square; and
    the metrology structure within the target is rectangular and desirably square.
22. The target according to clause 21, wherein the alignment structure comprises four elongate segments with each elongate segment arranged between an edge of the outer perimeter of the metrology structure and an edge of the inner perimeter of the target.
23. The target according to clause 22, wherein, for each of the four elongate segments of the alignment structure, the structures within the elongate segment are arranged to generate a beat pattern that has peaks and troughs along the length of an image of the elongate segment.
24. The target according to clause 21 when dependent on clause 18, wherein:
    the alignment structure comprises exactly two elongate segments with each elongate segment arranged between an edge of the outer perimeter of the metrology structure and an edge of the inner perimeter of the target;
    the elongate segments are provided on opposite sides of the metrology structure; and
    the longitudinal axis of each elongate segment is orthogonal to a direction of periodicity of the periodic structure within the metrology structure.
25. The target according to clause 24, wherein, for each of the two elongate segments of the alignment structure, the structures within the elongate segment are arranged to generate a beat pattern that has peaks and troughs along the length of an image of the elongate segment.
26. The target according to clause 24, wherein, for each of the two elongate segments of the alignment structure, the structures within the elongate segment are arranged to generate a beat pattern that has peaks and troughs along the width of an image of the elongate segment.
27. The target according to any of clauses 21 to 26, wherein part of the alignment structure in one or more corners of the target are non-periodic.
28. The target according to clause 27, wherein an overall reflectance of the metrology structure in respect of illumination by source radiation, averaged over the metrology structure, differs from an overall reflectance of the one or more non-periodic parts of the alignment structure in respect of illumination by the source radiation, averaged over the parts of the alignment structure, by at least 20%.
29. The target according to any of clauses 1 to 28, wherein the target is a square and the length of each side of the target is 5 µm.
30. The target according to any of clauses 1 to 29, wherein the target is a square and the length of each side of the target is 2 µm.
31. The target according to any of clauses 1 to 30, wherein the structures comprised by the alignment structure are arranged such that, when the alignment structure is illuminated with source radiation, the detected radiation resulting from scattering of the source radiation by the target comprises higher order diffracted rays than the zeroth order.
32. The target according to any of clauses 1 to 31, wherein a pitch of the metrology structure is less than 100 nm.
33. The target according to any of clauses 1 to 32, wherein the surface area of the metrology structure is between 3 and 12 times the surface area of the alignment structure.
34. A method of measuring a target formed on a substrate, the target comprising an alignment structure and a metrology structure, the method comprising:
    a first measurement process comprising illuminating the target with first radiation and detecting radiation resulting from scattering of the first radiation from the target; and
    a second measurement process comprising illuminating the target with second radiation and detecting radiation resulting from scattering of the second radiation from the target,
    wherein the first measurement process detects a position of the alignment structure,
    wherein the second measurement process uses the position of the alignment structure detected by the first measurement process to align a radiation spot of the second radiation onto a desired location within the metrology structure, and
    wherein the target is a target according to any of clauses 1 to 33.
35. The method according to clause 34, wherein the structures comprised by the alignment structure are sub-resolution of the first measurement process.
36. The method according to clause 34 or clause 35, wherein the first measurement process comprises forming an image of the alignment structure and the metrology structure.
37. The method according to any of clauses 34 to 36, wherein the first measurement process uses computer-implemented pattern recognition to detect the alignment structure.
38. The method according to any of clauses 34 to 37, wherein the first measurement process detects the alignment structure in dependence on beat patterns that are generated when the alignment structure is illuminated by the first radiation.
39. The method according to any of clauses 34 to 38, wherein:
    the first measurement process does not detect the alignment structure in dependence on the zeroth order ray in the detected radiation resulting from scattering of the first radiation by the target to detect the alignment structure; and the first measurement process detects the alignment structure in dependence on higher order rays than the zeroth mode in the detected radiation resulting from scattering of the first radiation by the alignment structure to detect the alignment structure.

40. A metrology apparatus for measuring a target formed on a substrate, the apparatus comprising:

a first measurement system configured to illuminate the target with first radiation and detect radiation resulting from scattering of the first radiation from the target;

a second measurement system configured to illuminate the target with second radiation and detect radiation resulting from scattering of the second radiation from the target; and a controller configured to:

detect a position of the alignment structure using the radiation detected by the first measurement system; and control the second measurement system to use the detected position of the alignment structure to align a radiation spot of the second radiation onto a desired location within the metrology structure, wherein the target is a target according to any of clauses 1 to 33.

41. The apparatus according to clause 40, wherein the structures comprised by the alignment structure are sub-resolution of the first measurement system.

42. The apparatus according to clause 40 or clause 41, wherein the first measurement system is configured to form an image of the alignment structure and the metrology structure.

43. The apparatus according to any of clauses 40 to 42, wherein the first measurement system is configured to use computer-implemented pattern recognition to recognize the alignment structure.

44. The apparatus according to any of clauses 40 to 43, wherein the first measurement system is configured to detect the alignment structure in dependence on beat patterns that are generated when the alignment structure is illuminated by the first radiation.

45. The apparatus according to any of clauses 40 to 44, wherein:

the first measurement system is configured to not detect the alignment structure in dependence on the zeroth order ray in the detected radiation resulting from scattering of the first radiation by the target to detect the alignment structure; and the first measurement system is configured to detect the alignment structure in dependence on higher order rays than the zeroth mode in the detected radiation resulting from scattering of the first radiation by the alignment structure to detect the alignment structure.

46. A lithographic cell comprising:

a lithographic apparatus configured to perform a lithographic process to define a target on a substrate; and the metrology apparatus of any of clauses 40 to 45 configured to measure the target.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic, and electrostatic optical components.

According to an embodiment, at least a portion of a method described herein may be performed by a computer system in response to executing one or more sequences of one or more instructions contained in, e.g., a computer-readable medium such as a memory. Such instructions may be read into memory from another computer-readable medium. Execution of the sequences of instructions causes the computer system to perform one or more process steps described herein. One or more processors in a multi-processing arrangement may be employed to execute the sequences of instructions. In an embodiment, hard-wired circuitry may be used in place of or in combination with software instructions. Thus, the description herein is not limited to any specific combination of hardware circuitry and software.

A computer-readable medium refers to any medium that participates in providing instructions to a processor for execution. Such a medium may take many forms, including but not limited to, a non-transitory medium such as non-volatile media and volatile media. Non-volatile media include, for example, optical or magnetic disks. Volatile media include dynamic memory. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, or any other medium from which a computer can read.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A target formed on a substrate, the target comprising:
an alignment structure; and
a metrology structure having a larger area than the alignment structure,
wherein the alignment structure comprises sub-structures that are arranged to generate a beat pattern when the alignment structure is illuminated with source radiation, the beat pattern enabling location of the metrology structure for measurement.

2. The target according to claim 1, wherein the beat pattern is a series of peaks and troughs along an image of the alignment structure.

3. The target according to claim 1, wherein the sub-structures comprise a plurality of spaced straight lines in a single layer of the substrate.

4. The target according to claim 3, wherein the widths of the lines vary along the sub-structures.

5. The target according to claim 4, wherein the variation in line widths repeats periodically with a period that is larger than a pitch of the metrology structure.

6. The target according to claim 5, wherein the variation in line widths repeats periodically with a period that is between 3 and 50 times larger than the pitch of the metrology structure.

7. The target according to claim 5, wherein the line widths and period that the line widths repeat are determined in dependence on the wavelength of the source radiation.

8. The target according to claim 3, wherein a line spacing between sets of adjacent lines is substantially constant.

9. The target according to claim 3, wherein each line spacing is either close to or at a pitch of the metrology structure.

10. The target according to claim 9, wherein each line spacing is within 10% of the pitch of the metrology structure.

11. The target according to claim 1, wherein the sub-structures comprise a grating in each of a plurality of layers of the substrate.

12. The target according to claim 11, wherein:
a first layer of the substrate comprises a first grating with a first pitch; and
a second layer of the substrate comprises a second grating with a second pitch that is different from the first pitch.

13. The target according to claim 12, wherein the first pitch and second pitch are close to the pitch of the metrology structure.

14. The target according to claim 13, wherein the first pitch and second pitch are within 10% of the pitch of the metrology structure.

15. The target according to claim 14, wherein the first pitch and second pitch have a least common multiple of the first pitch and second pitch between 3 and 50 times the first pitch.

16. The target according to claim 1, wherein, when the structures comprised by the alignment structure are illuminated with source radiation, a beat pattern is generated that has peaks and troughs parallel to a direction of periodicity of a periodic structure within the metrology structure.

17. The target according to claim 1, wherein the alignment structure comprises four elongate segments with each elongate segment arranged between an edge of the outer perimeter of the metrology structure and an edge of the inner perimeter of the target.

18. The target according to claim 1, wherein:
the alignment structure comprises exactly two elongate segments with each elongate segment arranged between an edge of the outer perimeter of the metrology structure and an edge of the inner perimeter of the target;
the elongate segments are provided on opposite sides of the metrology structure; and
the longitudinal axis of each elongate segment is orthogonal to a direction of periodicity of a periodic structure within the metrology structure.

19. A method of measuring a target formed on a substrate, the target comprising an alignment structure and a metrology structure and the method comprising:
a first measurement process comprising illuminating the target with first radiation and detecting radiation resulting from scattering of the first radiation from the target; and
a second measurement process comprising illuminating the target with second radiation and detecting radiation resulting from scattering of the second radiation from the target,
wherein the first measurement process detects a position of the alignment structure,
wherein the second measurement process uses the position of the alignment structure detected by the first measurement process to align a radiation spot of the second radiation onto a desired location within the metrology structure, and
wherein the alignment structure comprises sub-structures that are arranged to generate a beat pattern when the alignment structure is illuminated with the first radiation.

20. A metrology apparatus for measuring a target formed on a substrate, the target comprising an alignment structure and a metrology structure and the apparatus comprising:
a first measurement system configured to illuminate the target with first radiation and detect radiation resulting from scattering of the first radiation from the target;
a second measurement system configured to illuminate the target with second radiation and detect radiation resulting from scattering of the second radiation from the target; and
a controller configured to:
detect a position of the alignment structure using the radiation detected by the first measurement system; and
control the second measurement system to use the detected position of the alignment structure to align a radiation spot of the second radiation onto a desired location within the metrology structure, wherein the alignment structure comprises sub-structures that are arranged to generate a beat pattern when the alignment structure is illuminated with the first radiation.

* * * * *